(12) United States Patent
Cok

(10) Patent No.: US 7,750,558 B2
(45) Date of Patent: Jul. 6, 2010

(54) OLED WITH PROTECTIVE ELECTRODE

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 384 days.

(21) Appl. No.: 11/616,536

(22) Filed: Dec. 27, 2006

(65) Prior Publication Data

US 2008/0157654 A1 Jul. 3, 2008

(51) Int. Cl.
*H01J 1/62* (2006.01)
(52) U.S. Cl. .............................. 313/504; 445/24; 445/25
(58) Field of Classification Search ......... 313/500–512; 445/24–25
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 6,226,890 B1 | 5/2001 | Boroson et al. | |
| 6,268,695 B1 | 7/2001 | Affinito | |
| 6,413,645 B1 | 7/2002 | Graff et al. | |
| 6,488,555 B2 | 12/2002 | Pichler et al. | |
| 6,522,067 B1 | 2/2003 | Graff et al. | |
| 6,768,257 B1 * | 7/2004 | Yamada et al. | 313/504 |
| 2002/0011783 A1 * | 1/2002 | Hosokawa | 313/504 |
| 2002/0125819 A1 * | 9/2002 | Mishima | 313/504 |
| 2004/0090177 A1 * | 5/2004 | Han et al. | 313/504 |
| 2004/0169460 A1 * | 9/2004 | Chang et al. | 313/498 |
| 2005/0127828 A1 * | 6/2005 | Chung et al. | 313/504 |
| 2005/0142379 A1 * | 6/2005 | Juni et al. | 428/690 |
| 2006/0186802 A1 | 8/2006 | Cok et al. | |
| 2006/0290271 A1 * | 12/2006 | Cok | 313/504 |
| 2007/0013293 A1 * | 1/2007 | Cok | 313/504 |

FOREIGN PATENT DOCUMENTS

| | | |
|---|---|---|
| WO | WO 97/42666 | 11/1997 |
| WO | WO 01/82390 | 11/2001 |
| WO | WO 03/090260 | 10/2003 |
| WO | WO 2004/105149 | 12/2004 |

OTHER PUBLICATIONS

C. W. Tang et al; "Organic Electroluminescent Diodes"; Applied Physics Letter; vol. 51; No. 12; Sep. 21, 1987; pp. 913-915.
C. W. Tang et al; "Electroluminescence of Doped Organic Thin Films"; Journal of Applied Physics; vol. 65; No. 9; May 1, 1989; pp. 3610-3616.

* cited by examiner

*Primary Examiner*—Nimeshkumar D Patel
*Assistant Examiner*—Mary Ellen Bowman
(74) *Attorney, Agent, or Firm*—Morgan Lewis & Bockius, LLP

(57) ABSTRACT

An OLED device, comprising: a first electrode; a conductive protective electrode comprising a transparent conductive oxide layer wherein the conductive protective electrode is a hermetic layer having a thickness less than 100 nm; one or more organic layers formed between the first electrode and conductive protective electrode, at least one organic layer being a light-emitting layer; and a patterned auxiliary electrode in electrical contact with the conductive protective electrode.

18 Claims, 5 Drawing Sheets

OLED WITH PROTECTIVE ELECTRODE

FIELD OF THE INVENTION

The present invention relates to organic light-emitting diode (OLED) devices, and more particularly, to OLED device structures for improving light output and lifetime formed by the deposition of thin-film materials, employing a process for forming a conductive protective electrode by vapor deposition.

BACKGROUND OF THE INVENTION

Organic light-emitting diodes (OLEDs) are a promising technology for flat-panel displays and area illumination lamps. The technology relies upon thin-film layers of organic materials coated upon a substrate. OLED devices generally can have two formats known as small-molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved. However, the materials comprising the organic EL element are sensitive and, in particular, are easily destroyed by moisture and high temperatures (for example greater than 140 degrees C.).

It has been found that one of the key factors that limits the efficiency of OLED devices is the inefficiency in extracting the photons generated by the electron-hole recombination out of the OLED devices. Due to the relatively high optical indices of the organic and transparent electrode materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner. Moreover, the organic and electrode materials absorb light, further reducing the device efficiency.

A typical OLED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent cathode layer. Light generated from such an alternative device may be emitted through the top transparent electrode. This is commonly referred to as a top-emitting device. In these typical devices, the index of the ITO layer, the organic layers, and the glass is about 1.8-2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

A variety of techniques have been proposed to improve the out-coupling of light from thin-film light emitting devices. One such technique, taught in US 2006/0186802 entitled "OLED Device having Improved Light Output" by Cok et al, which is hereby incorporated in its entirety by reference, describes the use of scattering layers formed over the transparent electrode of a top-emitter OLED device. It also teaches the use of very thin layers of transparent encapsulating materials deposited on the electrode to protect the electrode from the scattering layer deposition. Preferably, the layers of transparent encapsulating material have a refractive index comparable to the refractive index range of the transparent electrode and organic layers, or is very thin (e.g., less than about 0.2 micron) so that wave guided light in the transparent electrode and organic layers will pass through the layers of transparent encapsulating material and be scattered by the scattering layer.

Transparent conductive electrodes typically employ sputter-deposited conductive metal oxides such as indium tin oxide. Such electrodes suffer from a variety of handicaps, principally inadequate conductivity and, in some circumstances, transparency. In top-emitting device structures, such sputter-deposited layers may also physically damage the underlying organic material layers. Barrier layers providing sputter-deposition protection have been suggested, such as described in WO 97/42666 and U.S. Pat. No. 6,488,555. However, the described barrier layers and sputter deposited electrode layers typically are not sufficiently impermeable to environmental contaminants when employed as the transparent top electrode in a top-emitting device, necessitating the use of additional encapsulating overcoat layers or sealed transparent glass covers, thereby exacerbating problems with light trapping and/or increased costs for such devices.

It is well known that OLED materials are subject to degradation in the presence of environmental contaminants, in particular moisture. Organic light-emitting diode (OLED) display devices typically require humidity levels below about 1000 parts per million (ppm) to prevent premature degradation of device performance within a specified operating and/or storage life of the device. Control of the environment to this range of humidity levels within a packaged device is typically achieved by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the above level. See for example U.S. Pat. No. 6,226, 890 B1 issued May 8, 2001 to Boroson et al. describing desiccant materials for moisture-sensitive electronic devices. Such desiccating materials are typically located around the periphery of an OLED device or over the OLED device itself.

In alternative approaches, an OLED device is encapsulated using thin multi-layer coatings of moisture-resistant material. For example, layers of inorganic materials such as metals or metal oxides separated by layers of an organic polymer may be used. Such coatings have been described in, for example, U.S. Pat. Nos. 6,268,695, 6,413,645 and 6,522,067. A deposition apparatus is further described in WO2003090260 A2 entitled "Apparatus for Depositing a Multilayer Coating on Discrete Sheets". WO0182390 entitled "Thin-Film Encapsulation of Organic Light-Emitting Diode Devices" describes the use of first and second thin-film encapsulation layers made of different materials wherein one of the thin-film layers is deposited at 50 nm using atomic layer deposition (ALD) discussed below. According to this disclosure, a separate protective layer is also employed, e.g. parylene. Such thin multilayer coatings typically attempt to provide a moisture permeation rate of less than $5 \times 10^{-6}$ gm/m²/day to adequately protect the OLED materials. In contrast, typically polymeric materials have a moisture permeation rate of approximately 0.1 gm/m² day and cannot adequately protect the OLED materials without additional moisture blocking layers. With the addition of inorganic moisture blocking layers, 0.01 gm/m²/day may be achieved and it has been reported that the use of relatively thick polymer smoothing layers with inorganic layers may provide the needed protection. Thick inorganic layers, for example 5 microns or more of ITO or ZnSe, applied by conventional deposition techniques such as sputtering or vacuum evaporation may also provide adequate protection, but thinner conventionally coated layers may only provide protection of 0.01 gm/m²/day.

WO2004105149 A1 entitled "Barrier Films for Plastic Substrates Fabricated by Atomic Layer Deposition" published Dec. 2, 2004 describes gas permeation barriers that can be deposited on plastic or glass substrates by atomic layer deposition (ALD). Atomic Layer Deposition is also known as Atomic Layer Epitaxy (ALE) or atomic layer CVD (AL-CVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also cause additional problems with light trapping in the layers since they may be of lower index than the light-emitting organic layers.

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Atomic layer deposition ("ALD") is an alternative film deposition technology that can provide improved thickness resolution and conformal capabilities, compared to its CVD predecessor. In the present disclosure, the term "vapor deposition" includes both ALD and CVD methods. The ALD process segments the conventional thin-film deposition process of conventional CVD into single atomic-layer deposition steps. Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate, when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \qquad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all the initial AH ligands on the surface are replaced with $AML_{x-1}$ species. The reaction stage is typically followed by an inert-gas purge stage that eliminates the excess metal precursor from the chamber prior to the separate introduction of the other precursor.

A second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \qquad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $ML_x$ reaction;
2. $ML_x$ purge;
3. $AH_y$ reaction; and

4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness. However, such processes are expensive and lengthy, requiring vacuum chambers and repeated cycles of filling a chamber with a gas and then removing the gas.

ALD and CVD processes as conventionally taught, typically employ heated substrates on which the materials are deposited. These heated substrates are typically at temperatures above the temperatures organic materials employed in OLED devices can tolerate. In addition, the films formed in such processes may be energetic and very brittle, such that the subsequent deposition of any materials over the films destroys the film's integrity.

Thus, a need exists for an OLED architecture that decreases damage due to electrode deposition, increases lifetime, and improves the efficiency of light emission.

SUMMARY OF THE INVENTION

In accordance with one embodiment, the invention is directed towards an OLED device, comprising: a first electrode; a conductive protective electrode comprising a transparent conductive oxide layer wherein the conductive protective electrode is a hermetic layer having a thickness less than 100 nm; and one or more organic layers formed between the first electrode and conductive protective electrode, at least one organic layer being a light-emitting layer; and a patterned auxiliary electrode in electrical contact with the conductive protective electrode.

ADVANTAGES

The present invention provides an OLED device having improved yields, lifetime, and light emission efficiency.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

It will be understood that the figures are not to scale since the individual layers are too thin and the thickness differences of various layers too great to permit depiction to scale.

DETAILED DESCRIPTION OF THE INVENTION

Figure 1:
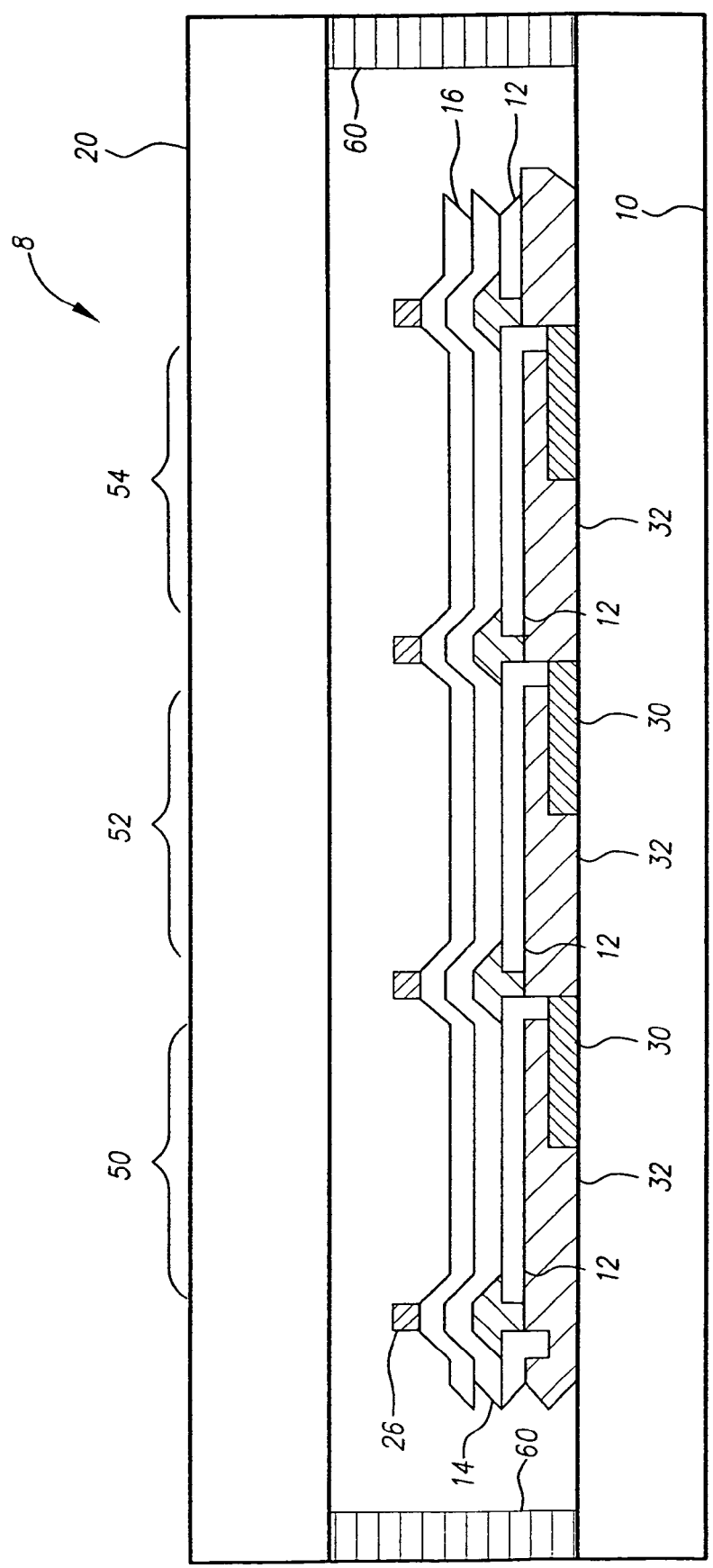
FIG. 1 is a cross section of a top-emitting OLED device according to an embodiment of the present invention.

Referring to FIG. 1, an OLED device 8 according to one embodiment of the present invention comprises a substrate 10, a first electrode 12, a conductive protective electrode 16 comprising a transparent conductive oxide wherein the conductive protective electrode 16 is a hermetic layer having a thickness less than 100 nm, and one or more organic layers 14 formed between the first electrode 12 and the conductive protective electrode 16, at least one organic layer being a light-emitting layer; and a patterned auxiliary electrode 26 in electrical contact with the conductive protective electrode 16.

In a top-emitter embodiment of the present invention, the conductive protective electrode 16 is a transparent top electrode and the first electrode 12 is a bottom electrode. The bottom electrode may be reflective. It is preferred that the conductive protective electrode 16 have a refractive optical index equal to or greater than the refractive optical index of the one or more organic layers. By providing such relative refractive indices, light emitted from the organic layers 14 will not be trapped by total internal reflection in the organic layers 14 since light may travel from the organic layers 14 into the equal- or higher-index conductive protective electrode 16. Thin-film electronic components 30 having planarization layers 32 may be employed to control the OLED device, as is known in the art. A cover 20 is provided over the OLED and electrode layers and adhered to the substrate 10 to protect the OLED device, for example using an adhesive 60. The bottom first electrode 12 is typically patterned to form light-emitting areas 50, 52, 54 while the patterned auxiliary electrode 26 may be formed between the light emitting areas (as shown) or under the light emitting areas (not shown). The conductive protective electrode 16 may be unpatterned and formed continuously over the organic layers 14.

Figure 5:
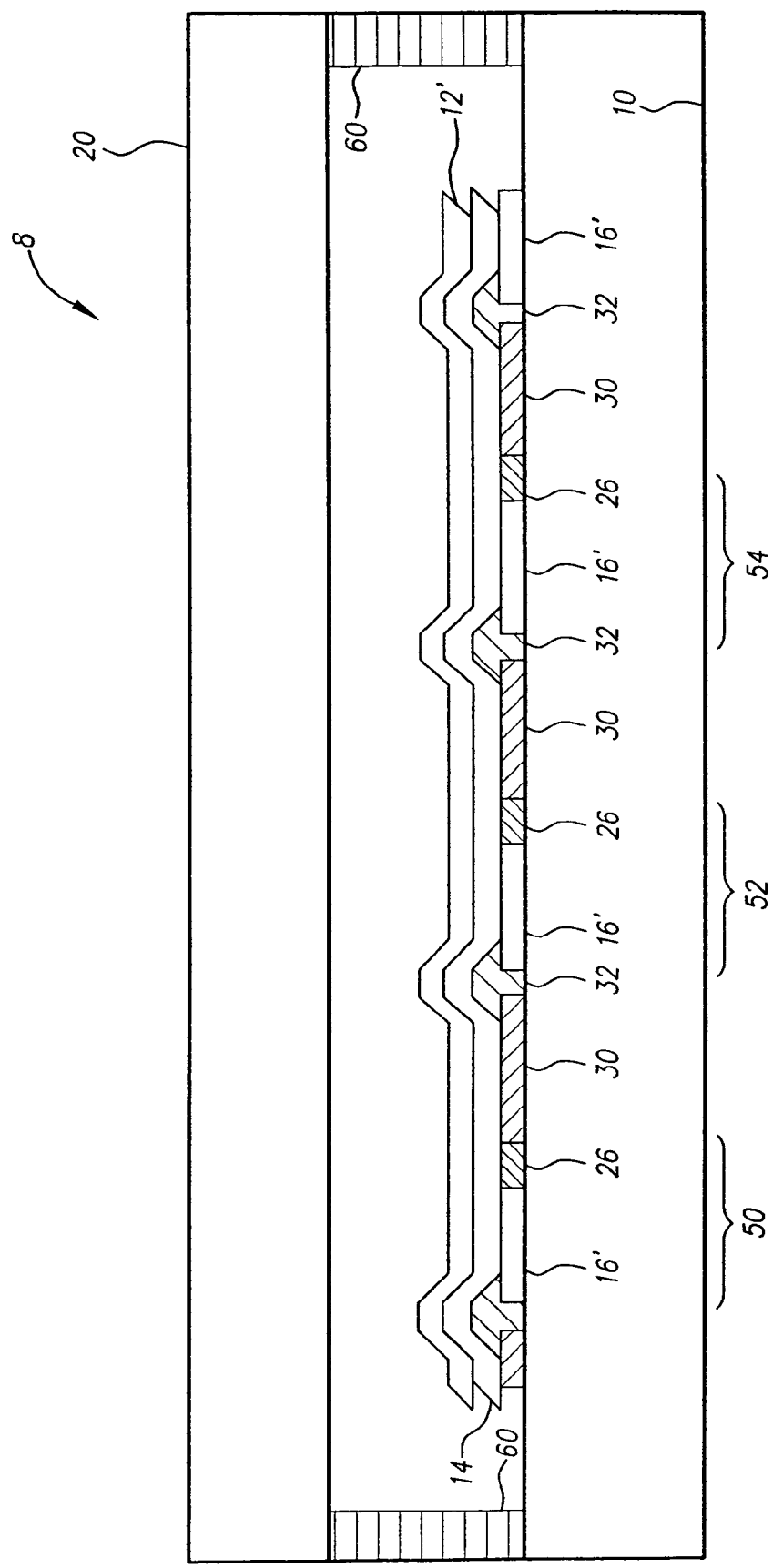
FIG. 5 is a cross section of a bottom-emitting OLED device according to an alternative embodiment of the present invention.

Referring to FIG. 5, in an alternative bottom emitter embodiment of the present invention, an OLED device 8 comprises a substrate 10, a conductive protective electrode 16' patterned over the substrate 10, one or more organic layers 14 formed over the conductive protective electrode 16, at least one organic layer 14 being a light-emitting layer, and a first electrode 12' formed over the one or more organic layers 14 opposite the protective electrode 16', wherein the conductive protective electrode 16' is a hermetic layer having a thickness less than 100 nm. A patterned auxiliary electrode 26 in electrical contact with the conductive protective electrode 16' is also formed over the substrate between the light emitting areas 50, 52, 54 defined by the patterned conductive protective electrode 16'. Because the deposition of the conductive protective electrode 16' may be done at relatively lower temperatures, the deposition process of the conductive protective electrode 16' is compatible with materials employed in flexible substrates, for example plastics, enabling the formation of flexible displays.

The auxiliary electrode 26 provides additional current-carrying capability to the device to improve the distribution of current to the various light-emitting areas. The auxiliary electrode 26 may be formed between the light-emitting areas (as shown in the figures) and may be opaque and formed, for example of thick metal bus lines. Alternatively, the auxiliary electrode 26 may be formed over or under portions of the transparent electrode, so long as light-emitted by the light-emitting layer can pass through at least a complementary portion of the transparent electrode. Hence, the auxiliary electrode 26 preferably is patterned.

Typical prior art transparent electrodes are sputtered or evaporated. Such deposition techniques typically do not form an adequate barrier layer to the passage of environmental contaminants. The transparent conductive protective electrode 16 forms a hermetic layer to prevent the passage of moisture and oxygen. A hermetic layer employed in the present invention is one that forms a barrier having a moisture permeation rate of less than $1\times10^{-4}$, preferably less than $1\times10^{-5}$ gm/m$^2$/day and more preferably less than $5\times10^{-6}$ gm/m$^2$/day, to adequately protect the OLED materials. Such layers may be formed of ordered and structured layers of molecules that completely coat a surface and whose molecules are in closely adjacent and in alignment with neighboring molecules. Evaporation and sputtering, in contrast, form random arrangements of molecules between which other contaminating molecules can pass.

To provide sufficiently high conductivity (e.g., to provide a resistivity, for example, of 100 ohms per square or less), typical prior art transparent electrodes are formed of relatively thick layers of transparent conductive oxides. While the transparent conductive protective electrode 16 employed in accordance with the invention must also be at least minimally conductive (e.g., providing a resistivity of 10,000 ohms per square or less), the transparent conductive protective electrode 16 may not itself need to be as conductive as other transparent electrode layers employed in the art due to the presence of patterned auxiliary electrode 26. According to the present invention, e.g., the transparent conductive protective electrode 16 may have a resistivity of greater than 100 ohms per square, greater than 500 ohms per square, or even greater than 1000 ohms per square. The smaller the individual light-emitting areas and the more extensive the auxiliary electrodes, the higher the resistivity of the transparent conductive protective electrode 16 may acceptably be. Such lower conductivity requirement enables the use of relatively thin transparent conductive protective electrodes, advantageously improving the transparency of such electrodes.

Figure 2:
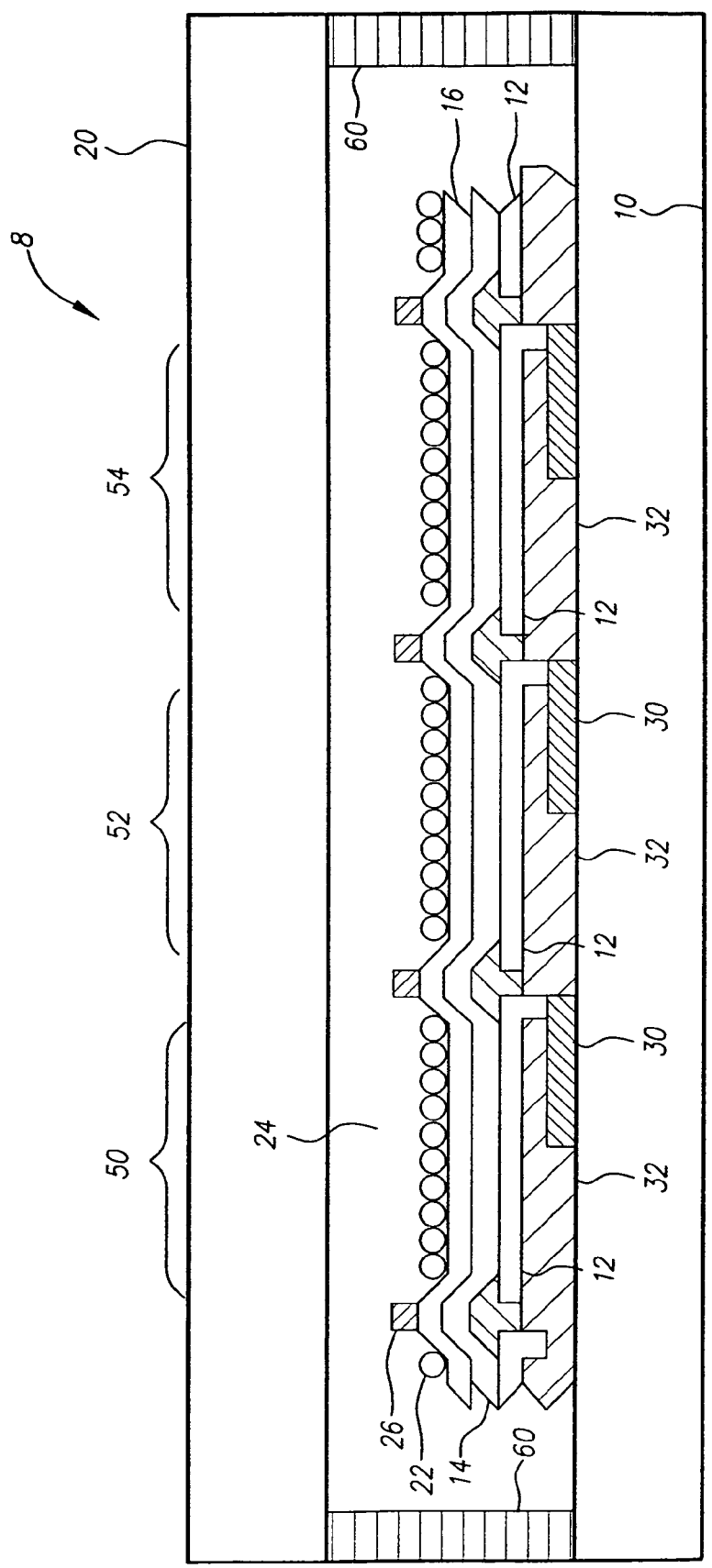
FIG. 2 is a cross section of an OLED device having a scattering layer according to an alternative embodiment of the present invention.

According to further embodiments of the present invention and as further illustrated in FIG. 2, a scattering layer 22 may be formed over the transparent conductive protective electrode 16 opposite the organic layer(s) 14. The scattering layer 22 scatters light trapped in the conductive protective electrode 16 and organic layers 14 by total internal reflection. To maintain the sharpness of a pixilated OLED device, a low-index element 24 having a refractive index lower than the refractive index of the light emitting layer is formed between the transparent conductive protective electrode 16 and the transparent cover 20 as taught in US 2006/0186802 "OLED Device having Improved Light Output" by Cok et al, which is hereby incorporated in its entirety by reference. The low-index element may be a vacuum or gas-filled space, as illustrated in FIG. 2.

In the prior art, the transparent electrode is typically formed as thickly as possible to enhance the conductivity of the electrode. However, as the transparent electrode becomes thicker, the amount of light absorbed by the electrode increases. A typical transparent electrode as suggested by the prior art is 100 nm or more thick. Such a thickness of ITO, for example, is not perfectly transparent and absorbs about 4% of the light traveling through the electrode, depending somewhat on the frequency of the light and the deposition conditions. This is not a large absorption, so that prior-art designs tend to prefer increased thickness, conductivity, and absorption. However, applicants have surprisingly found through optical modeling that the impact of the absorption of light in the transparent electrode is much greater. Light trapped within the transparent electrode 16 and organic layers 14 will travel at a higher angle with respect to the normal, thereby encountering a greater thickness of transparent material and resulting in a greater absorption than anticipated. Moreover, the trapped light will encounter the transparent electrode multiple times, thereby increasing the absorption experienced. When a scattering layer is employed to extract the trapped light, modeling indicates that an average light ray will pass through the transparent electrode three times at relatively higher angles to the normal, thereby increasing the practical absorption of the transparent layer by more than a factor of three, to greater than 12%. Moreover, an additional encapsulation layer formed over the transparent electrode, as taught by the prior art, may further increase the amount of light trapped and absorbed. Hence, by employing a hermetic, reduced-thickness transparent electrode without the use of an additional encapsulation layer, additional light may be extracted from the OLED device and the requisite conductivity provided by employing an auxiliary electrode.

Applicants have demonstrated that scattering layers provided directly on the transparent electrode have improved light extraction over designs that employ an additional encapsulation layer. However, the scattering layer deposition process, when performed over a sputter-deposited transparent ITO electrode, causes dark spots to grow, reducing device lifetime. Layers formed using the vapor deposition process do not cause dark spots to grow, indicating that an improved hermetic layer is present.

In some embodiments of the present invention (FIG. 3), the light-emitting organic layer 14 may emit white light, in which case color filters 40R, 40G, 40B may be formed, for example on the cover 20, to filter light to provide a full-color light-emissive device with colored light-emitting areas 50, 52, 54.

Figure 3:
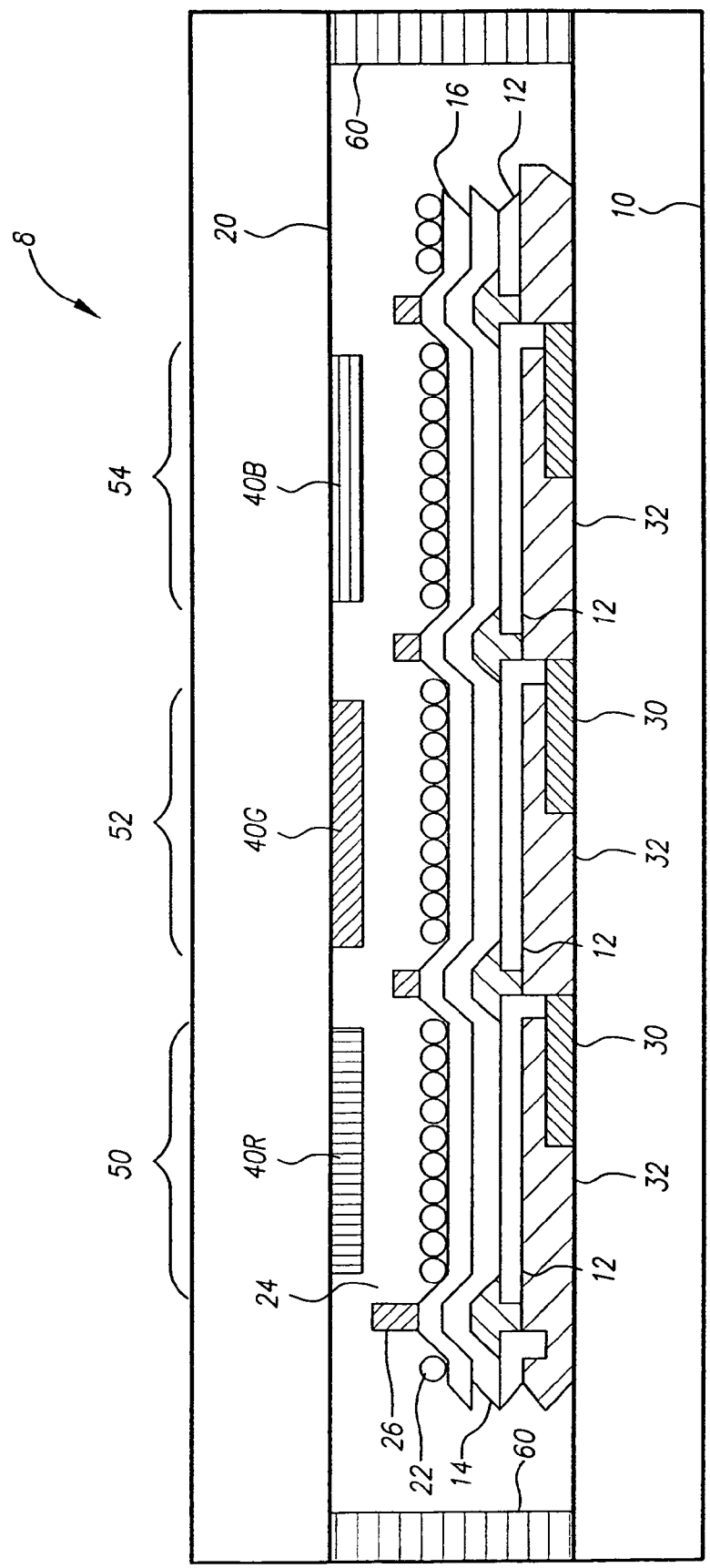
FIG. 3 is a cross section of an OLED device having color filters according to an alternative embodiment of the present invention.
Figure 4:
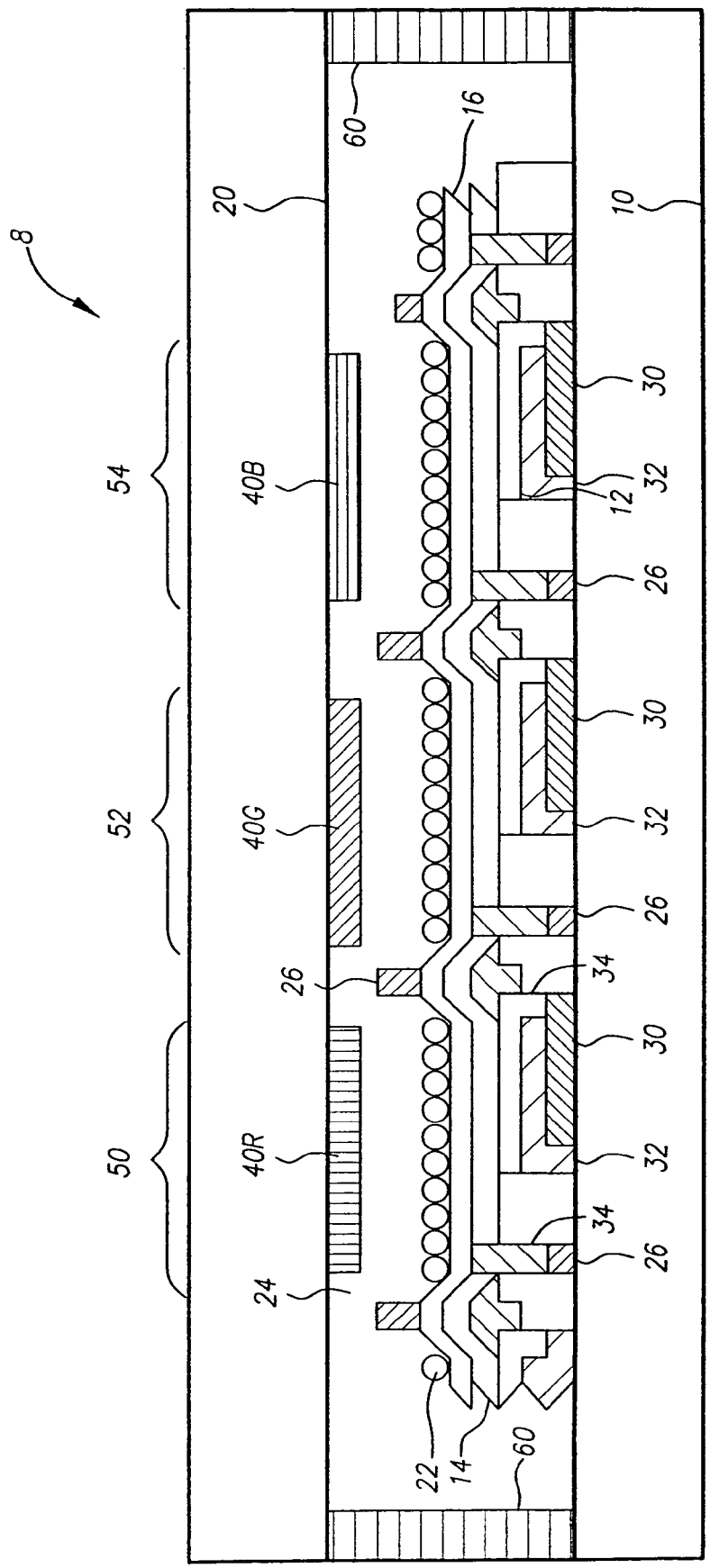
FIG. 4 is a cross section of an OLED device having vias according to an alternative embodiment of the present invention.

In various embodiments of the present invention, the auxiliary electrode 26 may be formed on the side of the conductive protective electrode 16 opposite the one or more organic layers, as shown in FIG. 3. Such layers may be deposited by sputtering or evaporating metals through masks, for example as described in U.S. Pat. No. 6,812,637 entitled "OLED Display with Auxiliary Electrode" by Cok et al. In alternative embodiments of the present invention, as shown in FIG. 4, the auxiliary electrode 26 may be formed on the side of the one or more organic layers 14 opposite the conductive protective electrode 16 and may be electrically connected to the conductive protective electrode 16 through vias 34 formed in the one or more organic layers 14. The auxiliary electrode may be formed using conventional photolithographic techniques while the vias may be formed using laser ablation, for example as described in U.S. Pat. No. 6,995,035 entitled "Method of Making a Top-Emitting OLED Device having Improved Power Distribution" by Cok et al. Materials employed in forming the auxiliary electrode may include, e.g., aluminum, silver, magnesium, and alloys thereof.

As employed herein, a hermetic layer is one in which atomic layer or various chemical vapor deposition processes are employed to form a layer resistive to penetration by moisture and oxygen. The hermetic conductive protective electrode may be formed by employing a vapor deposition process comprising alternately providing a first reactive gaseous material and a second reactive gaseous material, wherein the first reactive gaseous material is capable of reacting with the organic layers treated with the second reactive gaseous material. Alternatively, the conductive protective electrode is formed using an atomic layer deposition process, a vacuum chemical vapor deposition process, or atmospheric chemical vapor deposition process. These processes are similar in their use of complementary reactive gases, either in a system with a vacuum purge cycle or in an atmosphere. Generally, it is preferred to form the conductive protective electrode at a temperature less than 140 degrees C. to avoid damaging organic layers. Alternatively, the conductive protective electrode may be formed at a temperature less than 120 degrees C. or less than 100 degrees C. Applicants have successfully formed hermetic layers over organic materials using zinc oxide based compounds. Moreover, effective hermetic layers have been formed at temperatures of 100 degrees C.

Such layers are formed by alternately providing a first reactive gaseous material and a second reactive gaseous material, wherein the first reactive gaseous material is capable of reacting with the organic layers treated with the second reactive gaseous material. The first reactive gaseous material completely covers the exposes surface of the organic layers 14 while the second reactive gaseous material reacts with the first reactive gaseous material to form a layer highly resistant to environmental contaminants. In contrast, layers deposited by conventional means such as evaporation or sputtering do not form hermetic layers. Applicants have demonstrated the problems of the conventional deposition art for transparent electrodes in protecting organic materials and the improvements found by employing a hermetic layer formed by a vapor deposition process. Moreover, the vapor deposition process itself reduces the damage incurred by the underlying organic layers as compared to conventional sputtering processes.

According to an embodiment of the present invention, the conductive protective electrode 16 is formed at a temperature less than 140 degrees C. In typical, prior-art atomic layer deposition or chemical vapor deposition processes, the substrate and any layers coated thereon are heated to relatively high temperatures, for example >200 degrees C. Such higher temperatures may be useful in increasing the conductivity of deposited layers. However, according to the present invention, a reduced temperature employed in combination with an auxiliary electrode to enable adequate transparent electrode conductivity is preferred. In a more preferred embodiment of the present invention, the transparent conductive protective electrode 16 is formed at a temperature less than or equal to 120 degrees C., less than or equal to 100 degrees C., or less than or equal to 80 degrees C.

A wide variety of metal oxides may be employed to form the conductive protective electrode 16. In preferred embodiments, the conductive protective electrode 16 comprises a zinc oxide or a tin oxide. In general, dopants may be employed to improve the conductivity of the electrode, for example by employing aluminum or indium with zinc oxide to form aluminum zinc oxide or indium zinc oxide, and indium with tin oxide to form indium tin oxide.

A variety of thicknesses may be employed for the conductive protective electrode 16, depending on the subsequent processing of the device and environmental exposure. The thickness of the conductive protective electrode 16 may be selected by controlling the number of sequentially deposited layers of reactive gases. In various embodiments of the present invention, the conductive protective electrode 16 may be less than 100 nm thick, less than 75 nm thick, or less than 50 nm thick.

For top-emitting OLED devices, substrate 10 may be opaque to the light emitted by OLED device 8. Common materials for substrate 10 are glass or plastic. First electrode 12 may be reflective. Common materials for first electrode 12 are aluminum and silver or alloys of aluminum and silver. Organic EL element 14 includes at least a light emitting layer (LEL) but frequently also includes other functional layers such as an electron transport layer (ETL), a hole transport layer (HTL), an electron blocking layer (EBL), or a hole blocking layer (HBL), etc. The discussion that follows is independent of the number of functioning layers and independent of the materials selection for the organic EL element 14. Often a hole injection layer is added between organic EL element 14 and the anode and often an electron injection layer is added between organic EL element 14 and the cathode. In operation a positive electrical potential is applied to anode and a negative potential is applied to the cathode. Electrons are injected from the cathode into organic EL element 14 and driven by the applied electrical field to move toward the anode; holes are injected from the anode into organic EL element 14 and driven by the applied electrical field to move toward the cathode. When electrons and holes combine in organic EL element 14, light is generated and emitted by OLED device 8.

Material for the conductive protective electrode 16 can include inorganic oxides such as indium oxide, gallium oxide, zinc oxide, tin oxide, molybdenum oxide, vanadium oxide, antimony oxide, bismuth oxide, rhenium oxide, tantalum oxide, tungsten oxide, niobium oxide, or nickel oxide. These oxides are electrically conductive because of non-stoichiometry. The resistivity of these materials depends on the degree of non-stoichiometry and mobility. These properties as well as optical transparency can be controlled by changing deposition conditions. The range of achievable resistivity and optical transparency can be further extended by impurity doping. Even larger range of properties can be obtained by mixing two or more of these oxides. For example, mixtures of indium oxide and tin oxide, indium oxide and zinc oxide, zinc oxide and tin oxide, or cadmium oxide and tin oxide have been the most commonly used transparent conductors.

A top-emitting OLED device of the present invention may be formed by providing a substrate 10 with a bottom first electrode 12 and one or more organic layers 14 formed thereon, at least one organic layer being a light-emitting layer, forming a conductive protective top electrode 16 comprising a transparent conductive oxide over the one or more organic layers opposite the bottom electrode 12 wherein the conductive protective electrode 16 is a hermetic layer having a thickness less than 100 nm, and forming a patterned auxiliary electrode 26 in electrical contact with the conductive protective electrode 16.

Alternatively, a bottom-emitting OLED device may be formed by providing non-hermetic substrate 10, forming a conductive protective bottom electrode 16' comprising a transparent conductive oxide layer over the substrate, wherein the conductive protective electrode 16' is a hermetic layer having a thickness less than 100 nm, forming one or more organic layers 14 over the conductive protective electrode 16', at least one organic layer being a light-emitting layer, forming a top first electrode 12' over the organic layers, and forming a patterned auxiliary electrode 26 in electrical contact with the conductive protective electrode 16'. In such embodiment, the hermetic conductive protective electrode 16', together with other hermetic layers in the device, may provide protection against moisture permeation through a flexible non-hermetic substrate, thus maintaining the lifetime of the OLED organic materials.

According to various embodiments of the present invention, the conductive protective electrode 16 may be deposited by vapor deposition. As used herein, vapor deposition refers to any deposition method that deposits a first reactive material onto a substrate. A subsequent second reactive material is then provided to react with the first reactive material. The process is repeated until an adequate multi-layer thickness is formed. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art.

The conductive protective electrode may be formed using an atomic layer deposition process, a vacuum chemical vapor deposition process, or atmospheric chemical vapor deposition process and may be formed at a temperature less than 140 degrees C., less than 120 degrees C., or less than 100 degrees C.

While prior-art atomic layer deposition processes may be employed, in one embodiment of the present invention, a moving, gas distribution manifold having a plurality of openings through which first and second reactive gases are pumped is translated over a substrate to form a conductive, protective electrode 16. Co-pending, commonly assigned U.S. Ser. No. 11/392,007, filed Mar. 29, 2006, describes such a method in detail and the disclosure of which is hereby incorporated in its entirety by reference. However, the present invention may be employed with any of a variety of prior-art vapor deposition methods.

The conductive protective electrode deposition process may employ a continuous (as opposed to pulsed) gaseous material distribution. The conductive protective electrode deposition process cited above allows operation at atmospheric or near-atmospheric pressures as well as under vacuum and is capable of operating in an unsealed or open-air environment. Preferably, the protective electrode deposition process proceeds at an internal pressure greater than $\frac{1}{1000}$ atmosphere. More preferably, the transparent protective electrode is formed at an internal pressure equal to or greater than one atmosphere. Various gases may be employed, including inert gases such as argon, air, or nitrogen. In any case, it is preferred that the gas be dry to avoid contaminating the organic materials with moisture.

A continuous supply of gaseous materials for the system may be provided for depositing a thin film of material on a substrate. A first molecular precursor or reactive gaseous material may be directed over the substrate and reacts therewith. In a next step, a flow with inert gas occurs over the area. Then, in one embodiment of the present invention, relative movement of the substrate and the distribution manifold may occur so that a second reactive gas from a second orifice in a distribution manifold may react with the first reactive gas deposited on the substrate. Alternatively, the first reactive gas may be removed from the deposition chamber and the second reactive gas provided in the chamber to react with the previous layer on the substrate to produce (theoretically) a monolayer of a desired material. Often in such processes, a first molecular precursor is a metal-containing compound in gas form, and the material deposited is a metal-containing compound, for example, an organometallic compound such as diethylzinc. In such an embodiment, the second molecular precursor can be, for example, a non-metallic oxidizing compound. Inert gases may be employed between the reactive gases to further ensure that gas contamination does not occur. The cycle is repeated as many times as is necessary to establish a desired film.

The primary purpose of the second molecular precursor is to condition the substrate surface back toward reactivity with the first molecular precursor. The second molecular precursor also provides material from the molecular gas to combine with metal at the surface, forming compounds such as an oxide, nitride, sulfide, etc, with the freshly deposited metal-containing precursor.

According to the present invention, it may not be necessary to use a vacuum purge to remove a molecular precursor after applying it to the substrate. Purge steps are expected by most researchers to be the most significant throughput-limiting step in ALD processes.

Assuming that, for example, two reactant gases AX and BY are used. When the reaction gas AX flow is supplied and flowed over a given substrate area, atoms of the reaction gas AX may be chemically adsorbed on a substrate, resulting in a layer of A and a surface of ligand X (associative chemisorptions). Then, the remaining reaction gas AX may be purged with an inert gas. Then, the flow of reaction gas BY, and a chemical reaction between AX (surface) and BY (gas) occurs, resulting in a molecular layer of AB on the substrate (dissociative chemisorptions). The remaining gas BY and by-products of the reaction are purged. The thickness of the thin film may be increased by repeating the process cycle many times.

Because the film can be deposited one monolayer at a time it tends to be conformal and have uniform thickness and will therefore tend to fill in all areas on the substrate, in particular in pinhole areas that may otherwise form shorts. Applicants have successfully demonstrated the deposition of a variety of thin-films, including zinc oxide films over organic layers. The films can vary in thickness, but films have been successfully grown at temperatures of 100 degrees C. and of thicknesses ranging from a few nanometers to 100 nm. Preferably, the films are structured such that moisture permeability is minimized, for example with more crystalline films. To provide desired conductivity, in a preferred embodiment doped metal oxide compositions may be deposited, e.g., $ZnO:Al$, $ZnS:Mn$, $SrS:Ce$, $Al_2O_3:Er$, $ZrO_2:Y$ and the like.

Various gaseous materials that may be reacted are also described in Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference. In Table V1.5.1 of the former reference, reactants for various ALD processes are listed, including a first metal-containing precursors of Group II, III, IV, V, VI and others. In the latter reference, Table IV lists precursor combinations used in various ALD thin-film processes.

Optionally, the present protective electrode deposition process can be accomplished with the apparatus and system described in more detail in commonly assigned, copending U.S. Ser. No. 11/392,006, filed Mar. 29, 2006 by Levy et al. and entitled, "APPARATUS FOR ATOMIC LAYER DEPOSITION", hereby incorporated by reference.

In a preferred embodiment, ALD can be performed at or near atmospheric pressure and over a broad range of ambient and substrate temperatures. Within the context of the present invention, however, temperatures equal to or less than 140° C. are preferred to avoid damage to organic layers. Preferably, a relatively clean environment is needed to minimize the likelihood of contamination; however, full "clean room" conditions or an inert gas-filled enclosure would not be required for obtaining good performance when using preferred embodiments of the process of the present invention.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small-molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST

| | |
|---|---|
| 8 | OLED device |
| 10 | substrate |
| 12, 12' | first electrode |
| 14 | organic element layer |
| 16, 16' | conductive protective electrode |
| 20 | cover |
| 22 | scattering layer |
| 24 | low-index element |
| 26 | auxiliary electrode |
| 30 | thin-film electronic components |
| 32 | planarization layers |
| 34 | via |
| 40R, 40G, 40B | color filters |
| 50 | light-emitting area |
| 52 | light-emitting area |
| 54 | light-emitting area |
| 60 | adhesive |

The invention claimed is:

1. An active-matrix top-emitting OLED display device, comprising:
   a plurality of light-emitting OLEDs, each having
   i) a separate first electrode provided for each OLED;
   ii) a conductive protective electrode common to the plurality of light-emitting OLEDs, the conductive protective electrode comprising a transparent conductive oxide layer having a plurality of ordered and structured layers of molecules closely adjacent and in alignment with neighboring, identical molecules, a resistivity of 10,000 ohms/square or less, and a moisture permeation rate of less than $1\times10^{-4}$ gm/m$^2$/day, and wherein the conductive protective electrode is a hermetic layer having a thickness less than 100 nm;
   one or more organic layers formed between the first electrode and conductive protective electrode, at least one organic layer being a light-emitting layer; and
   a patterned auxiliary electrode having a conductivity greater than that of the conductive protective electrode in electrical contact with the conductive protective electrode.

2. The active-matrix top-emitting OLED display device of claim 1, wherein the auxiliary electrode is formed on a side of the conductive protective electrode opposite the one or more organic layers.

3. The active-matrix top-emitting OLED display device of claim 1, wherein the auxiliary electrode is formed on a side of the one or more organic layers opposite the conductive protective electrode and is electrically connected to the conductive protective electrode through a via formed in the one or more organic layers.

4. The active-matrix top-emitting OLED display device of claim 1, wherein the conductive protective electrode has an optical index equal to or greater than the optical index of the light-emitting layer.

5. The active-matrix top-emitting OLED display device of claim 1, further comprising a low-index layer formed on a side of the conductive protective electrode opposite the one or more organic layers, having an optical index less than the optical index of the light-emitting layer.

6. The active-matrix top-emitting OLED display device of claim 5, wherein the low-index layer is a vacuum or gas-filled space.

7. The active-matrix top-emitting OLED display device of claim 1, further comprising a scattering layer formed on the conductive protective electrode.

8. The active-matrix top-emitting OLED display device of claim 1, wherein the conductive protective electrode has a thickness less than or equal to 75 nm.

9. The active-matrix top-emitting OLED display device of claim 1, wherein the conductive protective electrode has a thickness less than or equal to 50 nm.

10. The active-matrix top-emitting OLED display device of claim 1, wherein the conductive protective electrode comprises zinc oxide or doped zinc oxide.

11. The active-matrix top-emitting OLED display device of claim 1, wherein the conductive protective electrode comprises aluminum zinc oxide.

12. The active-matrix top-emitting OLED display device of claim 1, further comprising a non-hermetic substrate and wherein the conductive protective electrode is formed between the substrate and organic layers.

13. The active-matrix top-emitting OLED display device of claim 1, further comprising a substrate, and wherein the organic layers are formed between the conductive protective electrode and the substrate.

14. A method of forming an active-matrix top-emitting OLED display device, comprising:
   providing a substrate with a bottom electrode and one or more organic layers formed thereon, at least one organic layer being a light-emitting layer;
   providing a plurality of light-emitting OLEDs on the substrate, each having
   i) a separate first electrode provided for each OLED;
   ii) a conductive protective top electrode common to the plurality of light-emitting OLEDs comprising a transparent conductive oxide having a plurality of ordered and structured layers of molecules closely adjacent and in alignment with neighboring, identical molecules, a resistivity of 10,000 ohms/square or less over the one or more organic layers opposite the bottom electrode, and a moisture permeation rate of less than $1\times10^{-4}$ gm/m$^2$/day, and comprises, and wherein the conductive protective electrode is a hermetic layer having a thickness less than 100 nm; and
   forming a patterned auxiliary electrode having a conductivity greater than that of the conductive protective electrode in electrical contact with the conductive protective electrode.

15. The method of claim 14, wherein the conductive protective electrode is formed by employing a vapor deposition process comprising alternately providing a first reactive gaseous material and a second reactive gaseous material, wherein the first reactive gaseous material is capable of reacting with the organic layers treated with the second reactive gaseous material.

16. The method of claim 14, wherein the conductive protective electrode is formed using an atomic layer deposition process, a vacuum chemical vapor deposition process, or atmospheric chemical vapor deposition process.

17. The method of claim 14, wherein the conductive protective electrode is formed at a temperature less than 140 degrees C.

18. The method of claim 14, wherein the conductive protective electrode is formed at a temperature less than 120 degrees C.

* * * * *